(12) United States Patent
Dunne et al.

(10) Patent No.: US 6,207,583 B1
(45) Date of Patent: Mar. 27, 2001

(54) PHOTORESIST ASHING PROCESS FOR ORGANIC AND INORGANIC POLYMER DIELECTRIC MATERIALS

(75) Inventors: Jude Dunne, Menlo Park; Joseph Kennedy, San Jose; Leroy Laizhong Luo, Fremont; Diane Cecile Howell, Saratoga; Nicole Eliette Charlotte Kuhl, Sunnyvale, all of CA (US)

(73) Assignees: AlliedSignal Inc.; Mattson Technologies, both of Morristown, NJ (US)

( * ) Notice: Subject to any disclaimer, the term of this patent is extended or adjusted under 35 U.S.C. 154(b) by 0 days.

(21) Appl. No.: 09/390,143

(22) Filed: Sep. 3, 1999

Related U.S. Application Data

(60) Provisional application No. 60/099,246, filed on Sep. 4, 1998.

(51) Int. Cl.[7] ..................................................... H01L 21/00
(52) U.S. Cl. ........................... 438/725; 134/1.2; 438/714; 438/715
(58) Field of Search ............................... 134/1.1, 1.2, 1.3, 134/30, 31; 216/67; 438/706, 710, 712, 725, 714, 715

(56) References Cited

U.S. PATENT DOCUMENTS

| 5,174,856 | 12/1992 | Hwang et al. | 156/643 |
|---|---|---|---|
| 5,382,316 | 1/1995 | Hills et al. | 156/643 |
| 5,534,231 | 7/1996 | Savas | 216/67 |
| 5,773,201 | * 6/1998 | Fujimura et al. | 134/1.2 X |
| 5,824,604 | 10/1998 | Bar-Gadda | 438/725 |
| 5,970,376 | * 10/1999 | Chen | 134/1.2 X |
| 6,093,655 | * 7/2000 | Donohoe et al. | 134/1.2 X |

OTHER PUBLICATIONS

Mattson Technology, "Aspen Strip Datasheet", pp. 1–30, A–1 through D1, 1997.

* cited by examiner

*Primary Examiner*—William Powell
(74) *Attorney, Agent, or Firm*—Skjerven Morrill MacPherson LLP; Roberta P. Saxon

(57) ABSTRACT

A process for removal of photoresist present on a polymer dielectric on a semiconductor substrate and for removal of photoresist residues on the inside walls of microvias formed in the dielectric layer. The process is conducted by generating a plasma in a plasma generator from a gas comprising one or more fluorine compound containing etchant gases and etching the substrate having a dielectric layer thereon, and a photoresist layer on the dielectric layer and on the inside walls of microvias formed in the dielectric layer. The etching is conducted at a temperature of from about 0° C. to about 90° C. and at a pressure of from about 10 torr or less, to thereby remove the photoresist present on the dielectric layer and on the inside walls of the microvias.

33 Claims, 14 Drawing Sheets

PHOTORESIST ASHING PROCESS FOR ORGANIC AND INORGANIC POLYMER DIELECTRIC MATERIALS

RELATED APPLICATIONS

This application claims the benefit of Provisional U.S. application serial no. 60/099,246, filed Sep. 4, 1998, which is incorporated herein by reference.

BACKGROUND OF THE INVENTION

1. Field of the Invention

The invention relates to an etching process useful in the manufacture of integrated circuit structures. More particularly, the invention relates to an etch process for the removal of photoresist residues present on a dielectric stack and on the inside walls of microvias formed in a dielectric layer on a semiconductor substrate.

2. Related Art

In the production of integrated circuits (IC's), a semiconductor substrate is provided with a series of layers comprising conductive lines and dielectric materials. The design of VLSI and ULSI chips involves the use of multiple levels of metal interconnects to connect active areas of the chip together. Conductive lines on opposite sides of a dielectric surface are interconnected by means of metals deposited in microvias in the dielectric. These interconnects have typically been composed of Al, W, polysilicon and Si/Al/Cu composites but may also include copper in newer generations of microchips. Metal lines are insulated by non-conducting materials, typically $SiO_2$ but may also have $SiO_2$/polymer dielectric combinations or polymer dielectric only. Such polymer dielectrics include spin-on glasses, and low dielectric constant polymers such as spin-on polymers, nanoporous silicas, and organic polymer insulators. The $SiO_2$/polymer dielectric layers insulate the metal lines and also impart structural integrity to the entire interconnect level allowing for the next interconnect level to be placed on top of the existing level. The number of such interconnect levels is increasing and will continue to increase as the dimensions of microchips decrease.

The many levels of metal lines are interconnected through holes or microvias which electrically connect metal lines on one level with metal lines on higher or lower levels. The vias are filled with conducting metals and pass through the polymer dielectric layers of the interconnect level to the metal line on the next interconnect level. The formation of these vias is therefore a critical factor in determining proper performance of the microchip device. Photolithographic processes, which use photoimageable materials to fabricate built-up IC's have been developed for via formation. In these processes, photoresists are coated onto a substrate and photoimaged to define via holes. The formation of a via involves several processing steps, one of which involves the removal of photoresist after the via has been patterned and etched by plasma chemistries. It is necessary to remove such residues from the microvias since, when such residues are present in microvias, they degrade interconnect and barrier layer deposition and performance. The photoresist, which remains on the portions of the circuit structure after patterning, has been conventionally removed by ashing or removal of the photoresist by excited oxygen species generated in a plasma. The usual processing occurs at high pressures and temperatures, often above 200° C. These oxygen species can, however, also attack material such as organic and inorganic polymer dielectrics. This attack results in a poor via profile and oxidation/hydration of the polymer dielectric resulting in high via resistance and poor chip performance.

Ashing techniques are generally preferred over wet etch techniques since the underlying metals are not attacked, and because ashing is sometimes more effective in removal of photoresist residues, particularly when the photoresist has been altered by reactive ion etching, high temperature post bakes, or the like. However, while prior ashing techniques are able to remove photoresists from the surface of a dielectric, they have been found to be less than satisfactory in removing photoresist residues from the inside walls of microvias through the polymer dielectrics. In addition, for polymer dielectrics, since prior art plasma processes used to remove residues have been conducted at high temperatures, there has been a tendency to shrink the films, oxidize the films, cause a degradation of the dielectric constant or cause water absorption which outgases during subsequent processing steps such as depositing barrier layers or interconnect metals. Other processes such as those which use $H_2$ and $N_2$ plasmas reduce such problems but remove the photoresist at a lower than desired rate.

U.S. Pat. No. 5,382,316 describes a process for the removal of photoresist residues from an integrated circuit structure using a plasma etch gas mixture of oxygen, water vapor and a fluorine containing gas. The process removes photoresist and etch residues from a substrate surface. There is no teaching of photoresist removal from vias in surface dielectrics. U.S. Pat. No. 5,174,856 describes a process for removing photoresist and chlorine containing residues remaining over a metal layer after etching of the metal layer on an integrated circuit structure. This is done by conducting a stripping step using either $O_2$ gas, $O_2$ gas and $N_2$ gas and/or a fluorocarbon gas plasma followed by a subsequent step using a combination of $O_2$ and NH3 gases. There is also no teaching of photoresist removal from vias in surface dielectrics. U.S. Pat. No. 5,824,604 teaches photoresist stripping using a plasma of an oxidizing gas, a fluorine containing compound and a hydrocarbon. The process preferentially strips photoresist from a substrate with little etching of oxide on the substrate surface. As in the patents described above, there is also no teaching of photoresist removal from vias. Other low temperature, non-damaging via ashing alternatives exist through the use of low temperature, low pressure reactive ion etch (RIE) tools. These, however, constitute a higher capital investment option.

It would be desirable to provide an improved process for the removal of photoresist remaining after microvia formation which would not only remove the photoresist mask from a dielectric surface on a substrate, but also remove any photoresist residues present on the inside walls of the microvias formed in a dielectric layer containing polymer dielectrics. A process would be desired which would also strip the photoresist at a commercially acceptable rate and which would reduce the tendency to shrink and oxidize the film and degrade the dielectric constant and cause water absorption of the polymer dielectric exposed in the via side wall.

SUMMARY

Photoresist present on a dielectric layer on a substrate and on the inside walls of microvias or trenches formed in the dielectric layer is removed by isotropically etching the dielectric layer and microvias with a plasma generated from a gas including one or more compounds containing fluorine. The etching is conducted in a plasma asher at relatively low temperatures of from about 0° C. to about 90° C. and at a pressure of from about 10 torr or less. While prior art oxygen plasmas remove photoresists at a rate of between 1–5μm/min at a temperature of 250° C., these plasmas damage polymer dielectrics that are exposed to the plasma in the via sidewall. The use of the present room temperature ashing process a using $CF_4$ and $O_2$ plasma results in reduced damage to the polymer dielectric film and still yields photoresist strip rates that are usually greater than 1 μm/min.

The invention provides a process for removing a photoresist present on a dielectric layer on a substrate and on the inside walls of microvias or trenches formed in the dielectric layer, which comprises:

introducing a substrate having a dielectric layer thereon, and a photoresist layer on the dielectric layer and on the inside walls of microvias or trenches formed in the dielectric layer into a plasma generator;

generating a plasma in the plasma generator from a gas comprising one or more fluorine compound containing etchant gases; and isotropically etching said photoresist layer with the plasma at a temperature of from about 0° C. to about 90° C. and at a pressure of from about 10 torr or less, to thereby remove the photoresist present on the dielectric layer and on the inside walls of the microvias or trenches.

According to another embodiment of the present invention, a two-step photoresist removal process is provided. In a first step, a substrate having a dielectric layer and a photoresist layer is isotropically etched for a short time period in a plasma generator with a plasma generated from a fluorine compound containing etchant gas until a portion of the photoresist layer is removed. The remainder of the photoresist is removed in a second step which comprises contacting the substrate with an organic solvent or etching with a plasma generated from $N_2$ and $H_2$ For ashing with an $N_2/H_2$ plasma as the second step, the two steps may be performed in either order.

DETAILED DESCRIPTION

Figure 1A:
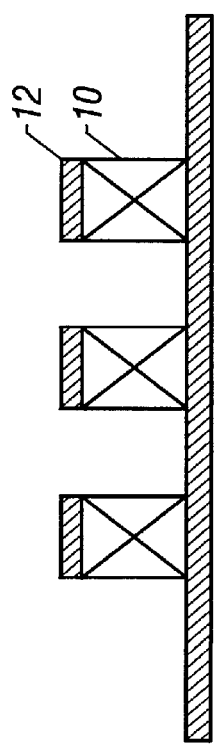
FIGS. 1(a)–1(d) illustrate the process of producing a semiconductor stack including vias, on which the process according to the present invention is practiced.
Figure 1B:
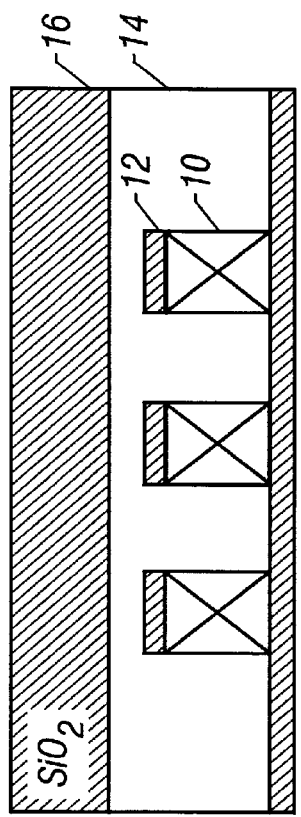
Figure 1C:
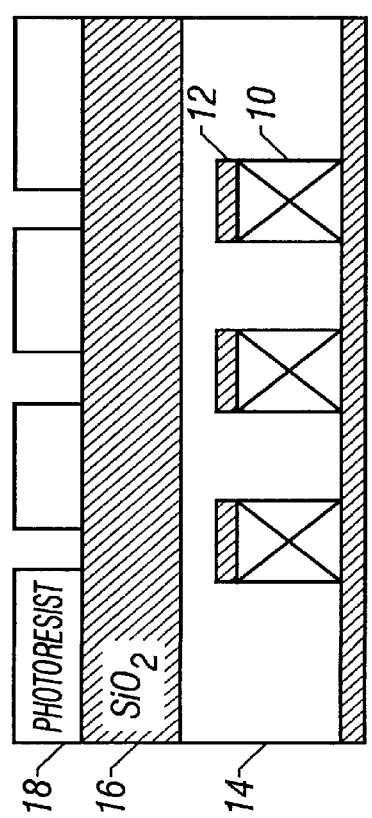

In the construction of an integrated circuit structure, a substrate is deposited with a dielectric layer, such as a polymer dielectric layer. Suitable substrates non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. The substrate may have lines on one or both substrate surfaces. Lines, when present, are typically formed by well known lithographic techniques and may be composed of a metal, an oxide, a nitride, or polysilicon. Suitable materials for the lines include titanium nitride, tantalum nitride, aluminum, aluminum alloys, copper, copper alloys, tantalum, and tungsten. These metal lines form the conductors of an integrated circuit.

A polymer dielectric layer, for example, a liquid spin-on polymer in a suitable solvent is applied to the substrate surface under ambient conditions and baked. Alternatively, a polymer dielectric layer is formed by chemical vapor deposition. The dielectric layer may comprise a silicon containing polymer such as an alkoxysilane polymer, a silsesquioxane polymer, or a siloxane polymer; a poly (arylene ether), a fluorinated poly(arylene ether), other polymeric dielectric materials or mixtures thereof. The polymer dielectric may be a spin-on-glass material such as a methylsiloxane material. Polymeric dielectric materials useful for the invention include an alkoxysilane polymer formed from an alkoxysilane monomer which has the formula $SiR_4$, where at least 2 of the R groups are independently $C_1$ to $C_4$ alkoxy groups and the balance, if any, are independently selected from the group consisting of hydrogen, alkyl, phenyl, halogen, substituted phenyl. Preferably each R is methoxy, ethoxy or propoxy. Such are commercially available from AlliedSignal as Nanoglass™. The most preferred alkoxysilane monomer is tetraethoxysilane (TEOS).

Also useful are hydrogensiloxanes which have the formula $(H_{0-1.0}SiO_{1.5-2.0})_x$, hydrogensilsesquioxanes which have the formula $(HSiO_{1.5})_x$, and organohydridosiloxanes which have the formulae $(H_{0-1.0}SiO_{1.5-2.0})_n(RSiO_{1.5})_m$, $(HSiO_{1.5})_n(RSiO_{1.5})_m$, and $(H_{0-1.0}SiO_{1.5-2.0})_n(R_{0-1.0}SiO_{1.5-2.0})_m$. In these polymer formulae, x is from about 8 to about 5000, the sum of n and m is from about 8 to about 5,000, and each R is independently H, $C_1$ to $C_8$ alkyl or $C_6$ to $C_{12}$ aryl. The weight average molecular weight may range from about 1,000 to about 220,000. Preferably the molecular weight ranges from about 5,000 to about 45,000. More preferably, the molecular weight ranges from about 14,000 to about 36,000.

Useful polymers within the context of this invention nonexclusively include hydrogensiloxane, methylsiloxane, hydrogensilsesquioxane, methylhydridosiloxane, ethylhydridosiloxane, propylhydridosiloxane, butylhydridosiloxane, tert-butylhydridosiloxane, phenylhydridosiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Films of these polymers may be applied in a spin-on process or may be formed by chemical vapor deposition. Useful organic polymers include polyimides, fluorinated and nonfluorinated polymers, for example, fluorinated and nonfluorinated poly(aryl ethers) available under the tradename FLARE™ from AlliedSignal Inc., and copolymer mixtures thereof. Additional organic dielectric materials include the polymeric material obtained from the phenyl-ethynylated aromatic monomer provided by Dow Chemical Company under the tradename SiLK™ The polymer component in a spin-on polymer solution is preferably present in an amount of from about 2% to about 50% by weight of the composition with the balance being a compatible solvent. A more preferred range is from about 2% to about 30% by weight of the composition.

Microvias and trenches are formed in the dielectric layer by well known photolithographic techniques using a photoresist composition. In the following discussion, it is understood that references to microvias and vias also include trenches. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, New Jersey as well as Shipley I-line photoresist. Negative photoresists are also widely commercially available. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. Vias are then formed by etching techniques which are well known in the art. Next the photoresist is completely removed from the dielectric surface and the inside walls of the vias by the plasma etching process of this invention.

The invention provides a process for the simultaneous removal of a photoresist mask from a dielectric surface on a substrate and from the inside walls of microvias in the dielectric material. The substrate having a photoresist top layer and multiple additional layers, through which vias have been etched, is placed in a plasma-generating reactor and a plasma is generated from a gas including one or more fluorine containing compounds.

The plasma-generating reactor is a microwave plasma-generating reactor with a microwave source near the substrate, a parallel plate reactor with a microwave or RF power source, or a reactor having a helical resonator. Preferably, the reactor is an inductively-coupled plasma-generating (ICP) reactor. An ICP reactor is described in U.S. Pat. Nos. 5,534,231 and 5,824,604, both assigned to Mattson Technology, Inc. and incorporated herein by reference. One example of an ICP reactor is the ASPEN reactor provided by Mattson Technology.

The ICP reactor includes a plasma generating chamber located above a wafer processing chamber. Induction coils which emit RF energy into the plasma generating chamber are usually located on the outside of the plasma generating chamber walls. The plasma generating chamber also includes a gas inlet. In accordance with the invention, one or more fluorine containing compound gases are flowed through the gas inlet into the plasma generator. Suitable fluorine containing compounds have the formula $C_xF_y$, wherein x is 1–4 and y is either 2x or 2x+2; $C_xH_zF_y$, wherein x is 1–4, y is either from 1 to 2x+1 or from 1 to 2x–1, and z is 2x+2–y when y ranges from 1 to 2x+1 or 2x–y when y ranges from 1 to 2x–1; $NF_3$; $SF_6$; or mixtures thereof. Preferred fluorine containing compounds nonexclusively include $CF_4$, $SF_6$, NF3, and mixtures thereof. Usually one or more gases or vapors such as $O_2$, $N_2$, $H_2$, and/or water vapor are also flowed into the reaction chamber. Optionally, ammonia or an inert carrier gas such as helium or argon and mixtures may also be flowed into the reaction chamber. In the most preferred embodiment the etchant gas comprises a mixture of $CF_4$ and $O_2$.

Preferably the fluorine containing compound is present in the etchant gas in an amount of from about 0.1% to about 10% by volume of the etchant gas. A more preferred range is from about 1% to about 8% and most preferably from about 4% to about 6%. Preferably the etchant gas contains $O_2$ in an amount of from about 50% to about 99.9% by volume of the etchant gas. A more preferred range is from about 92% to about 99% and most preferably from about 94% to about 96%. Preferably the etchant gas contains $H_2$ in an amount of from about 0% to about 15% by volume of the etchant gas. A more preferred range is from about 0% to about 10. Preferably the etchant gas comprises $N_2$ in an amount of from about 0% to about 95% by volume of the etchant gas. A more preferred range is from about 1% to about 20%. Preferably the etchant gas comprises water vapor in an amount of from about 25% to about 96% by volume of the etchant gas.

The flow of fluorine containing compound into the plasma generator of the etch chamber may range from about 10 standard cubic centimeters (sccm) to about 500 sccm. The flow of $O_2$ may range from about 1000 sccm to about 10,000 sccm, preferably from about 1500 sccm to about 3500 sccm. The flow of $N_2$ may range from about 500 sccm to about 4000 sccm, preferably from about 100 sccm to about 4000 sccm. The flow of hydrogen may range from about 50 sccm to about 400 sccm. It will, of course, be understood that the flow rate may need to be suitable adjusted for either a smaller or larger etch chamber, or for etch rate, uniformity optimization and to achieve the above relative gas proportions. The power level of the plasma may range from about 500 watts to about 5 kW or higher, depending upon the relative sizes of the plasma generator and the etch chamber.

The pressure in the etch chamber during the etching is usually maintained within a range of about 10 torr or less, such as about 2 torr or less. Preferably the pressure is maintained within a range of from about 0.01 torr to about 10 torr, more preferably from about 0.5 torr to about 5 torr and most preferably from about 0.5 torr to about 1.5 torr.

The temperature during the etch is usually maintained in a range of from about 0° C. to about 90° C., preferably from about 10° C. to about 80° C. and most preferably from about 10° C. to about 30° C. In the most preferred embodiment, the process is conducted at about room temperature. The plasma etch is usually carried out for a period of from about 30 seconds to about 5 minutes, preferably for about 60 seconds to about 3 minutes, and typically about 90 seconds, to remove all of the photoresist from the surface of the dielectric layer and the microvia side walls. The etch may, if desired, be carried out to an endpoint using, for example, a laser interferometer, to monitor to detect the dielectric interface. With the process of the present invention, photoresist removal rates are at least about 0.5 μm per minute and can exceed 1 μm per minute. Optionally the dielectric layer may undergo a subsequent wet chemical strip which removes residual organics, inorganics and metal residues from metal contact overetch. This is done by contacting the dielectric layer with an organic solvent such as, for example, an amine containing solvent. Examples of such amine solvents are available commercially from Ashland Chemical as ACT 970, ACT 935 and from EKC Technologies as EKC 265. The wet chemical strip is optionally followed by a rinse with deionized water. In an additional alternative process, after plasma ashing the dielectric layer is rinsed with deionized water to complete the photoresist removal process.

Figure 1D:
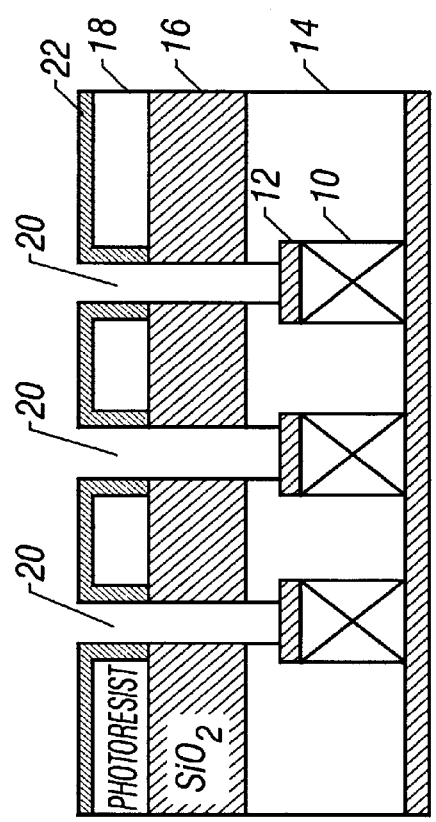
Figure 2:
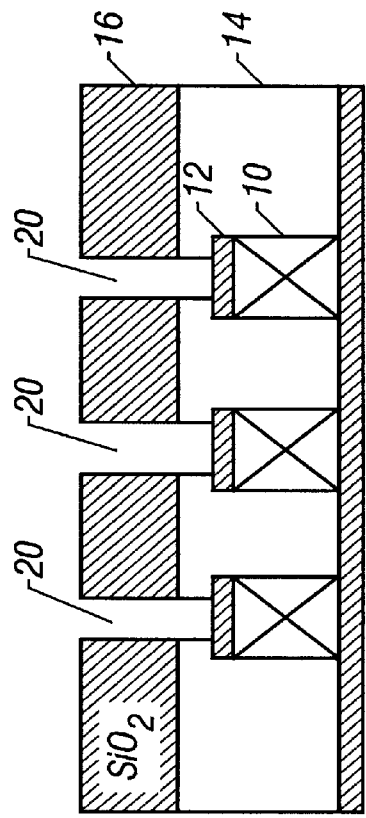
FIG. 2 shows the result of ashing the semiconductor stack of FIG. 1(d) with the prior art ashing process.
Figure 3:
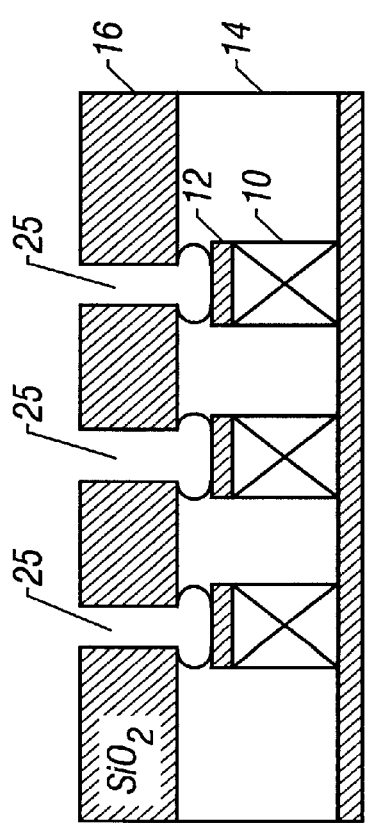
FIG. 3 shows the result of ashing the semiconductor stack of FIG. 1(d) with a process according to the present invention.

An ashing process according to the present invention in which photoresist is completely removed by plasma etching is illustrated in FIGS. 1(a)–1(d) and 3. As shown in FIG. 1(a), a metal interconnect 10 covered by an antireflective coating layer 12 is formed on a substrate by a standard process. A polymer dielectric material 14 is deposited over the interconnect structure, and an oxide layer, 16, is formed, typically by chemical vapor deposition of tetraethoxysilane, over the polymer dielectric layer, 14 , shown in FIG. 1(b). A photoresist layer is deposited and processed to form the patterned photoresist layer 18 shown in FIG. 1(c). Vias 20, in FIG. 1(d) are etched through the stack of FIG. 1(c) using low pressure anisotropic reactive ion etching (RIE), a medium density plasma reactor, or a high density plasma (HDP) etcher using a fluorocarbon gas. The via etching process removes some of photoresist 18 and deposits organic and inorganic residues on the side wall of vias 20. When the stack of FIG. 1(d), which includes a polymer dielectric layer, is subjected to a conventional photoresist ashing process using an oxygen plasma, the polymer dielectric layer 14 is undesirably etched under the oxide layer 16 resulting in the rounded profile of via 25, shown in FIG. 2. In contrast, according to the present invention, the stack of FIG. 1(d) is etched in a plasma reactor with etchant gases that include a fluorine containing compound resulting in the straight walled vias 20 of FIG. 3. In addition the present process removes photoresist residue from the sidewalls of vias 20.

Figure 4:
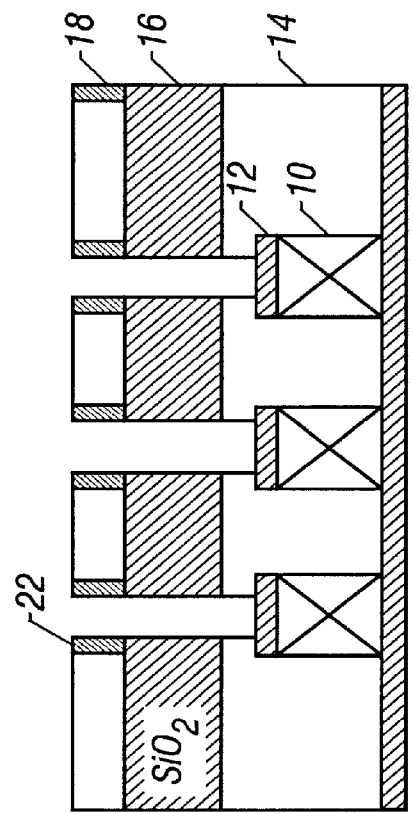
FIG. 4 shows the semiconductor stack of FIG. 1(d) after the first step of a two-step photoresist removal process according to another aspect of the present invention.

In a two-step process, the ashing process of the present invention is used to partially remove the photoresist before removal is completed by a wet chemical strip or by plasma ashing with a nitrogen/hydrogen gas combination, conventionally termed forming gas. When the vias 20 are etched through the stack of FIG. 1(c) by an RIE, medium density plasma, or an HDP process, the top and sides of photoresist layer 18 exposed to the energetic etching ions typically develop a hardened crust 22, shown in FIG. 1(d) that may be implanted with fluorinated species from the etch chemistry. Hardened crust 22 is resistant to conventional photoresist ashing and wet stripping processes. The stack of FIG. 1(d) is ashed in a plasma reactor with etchant gases that include a fluorine containing compound for a period of from about 3 to about 10 seconds to remove the crust 22. The partial photoresist removal results in the stack of FIG. 4 with photoresist layer 19 which has no top crust. According to the two-step photoresist removal process, the stack of FIG. 4 is then processed by wet chemical stripping or plasma stripping with forming gas to complete the removal of photoresist layer 19 . In the case of plasma stripping with forming gas as the second step, the two steps may be performed in either order. That is, alternatively, stripping with forming gas may precede the brief ashing in a plasma reactor with etchant gases that include a fluorine containing compound.

Figure 5A:
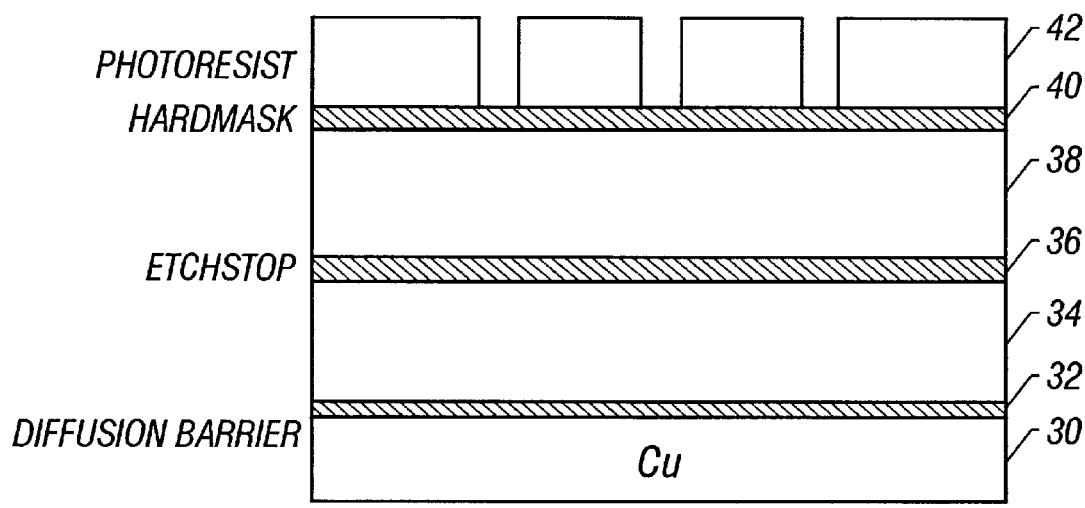
FIGS. 5(a)–5(d) illustrate the use of the photoresist removal process according to the present invention in a damascene process.
Figure 5B:
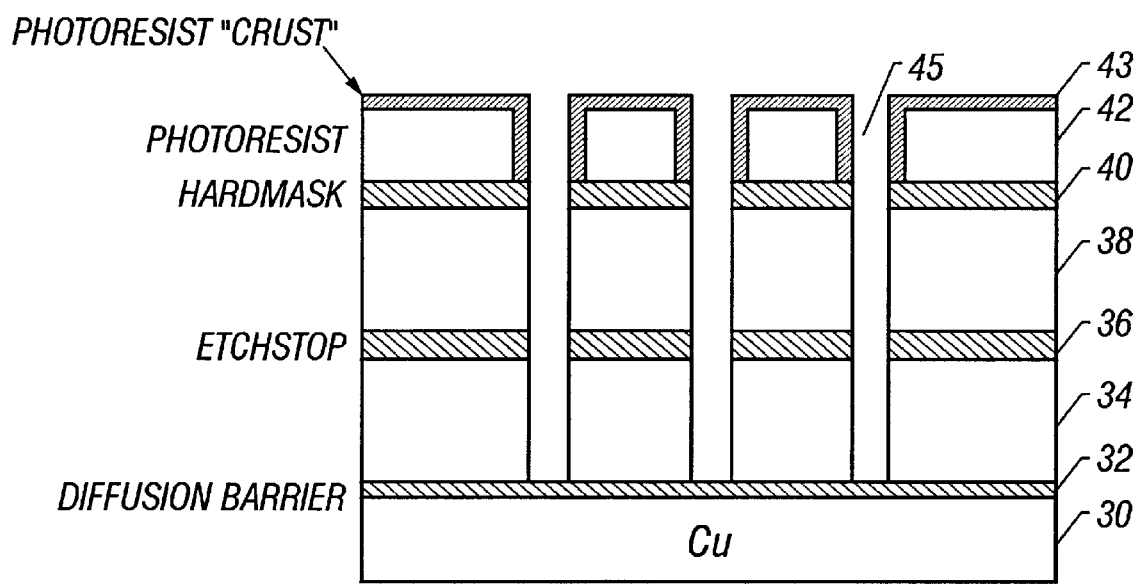
Figure 5C:
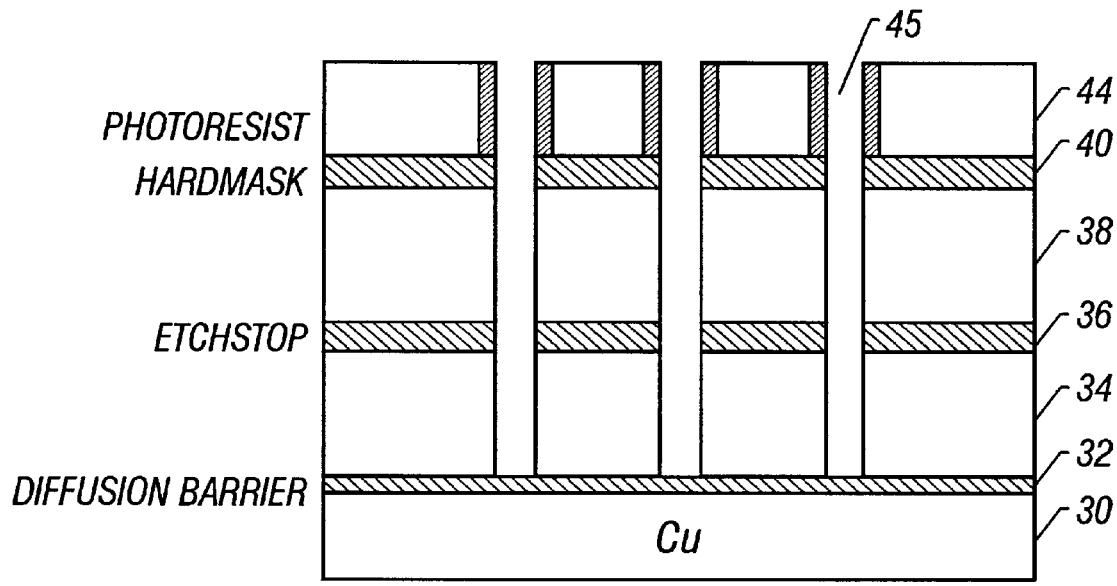
Figure 5D:
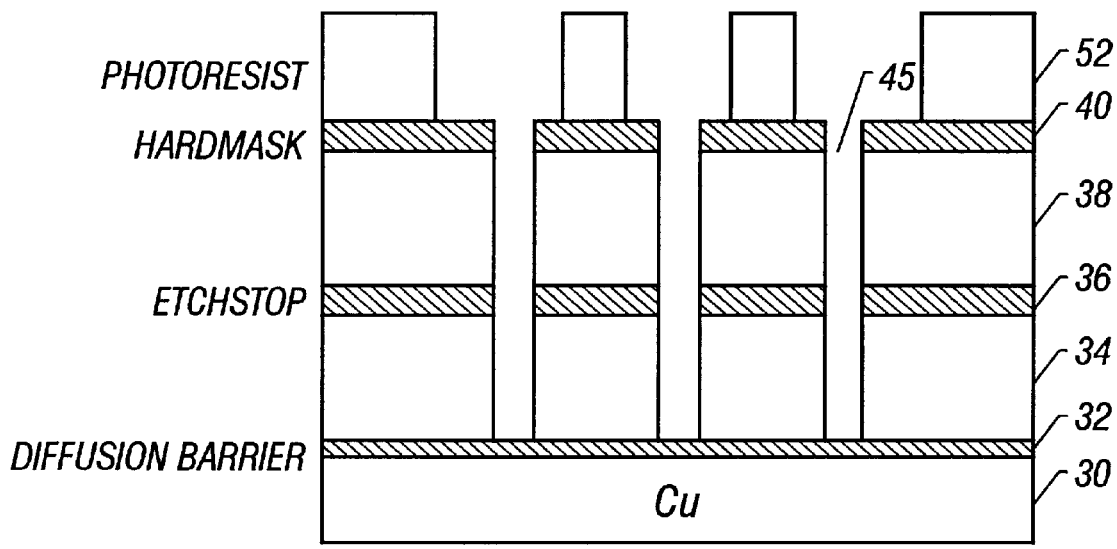

The two-step photoresist removal process of the present invention is also applied in a damascene integration process as illustrated in FIGS. 5(a)–5 (d). A semiconductor stack consisting of a bottom copper layer 30; a diffusion layer 32; a layer of a polymer dielectric material 34; an etchstop layer 36, typically CVD deposited oxide; a second polymer dielectric material layer 38, typically of the same material as layer 34 ; and a patterned photoresist layer 42 is shown in FIG. 5(a). When the vias 45 are etched through the stack of FIG. 5(a), a crust 43 is formed on photoresist layer 42, as discussed above. The stack of FIG. 5(b) is etched in a plasma reactor with etchant gases that include a fluorine containing compound for a period of from about 3 to about 10 seconds to remove the crust 43. The partial photoresist removal results in the stack of FIG. 5(c), which is processed by a wet chemical strip or in a forming gas plasma to complete the photoresist removal, leaving hardmask 40 as the top layer. A second photoresist layer 52 is deposited over hardmask 40 and patterned as shown in FIG. 5(d). After photoresist layer, 52 is used to form trenches over vias 45, it is removed by the same two step process of the present invention used to remove photoresist layer 44.

The following nonlimiting examples serve to illustrate the invention.

EXAMPLE 1

This example demonstrates ashing plasma chemistries which remove photoresists at reasonable rates after via etch and which do not damage dielectrics which are susceptible to oxidative damage when exposed in via sidewalls

Experimental

Films of three methylated siloxane polymers were deposited on bare silicon wafers. The materials and product characteristics are given in Table 1. The methylsiloxane polymer, denoted here, P1, is available commercially as Accuspin® T-14 from AlliedSignal Inc.

TABLE 1

Material Characterization

| Material | Film Thickness | Wt % Organic Content | Dielectric Constant |
| --- | --- | --- | --- |
| P1: methylsiloxane | ~2 kA | 10 | 3.8 |
| P2: 20% methyl, methylhydridosiloxane | ~4 kA | <5 | |
| P3: 80% methyl, methylhydridosiloxane | ~4 kA | <14 | 2.5 |

P2 and P3 were applied to semiconductor substrates and baked on three hotplates at 150° C., 200° C. and 350° C. for one minute on each hotplate, followed by a furnace anneal, under nitrogen, at 400° C. for 30 minutes. P1 was applied to a semiconductor substrate and baked on three hotplates at 100° C., 150° C. and 250° C. for one minute on each hotplate, followed by a furnace anneal, under nitrogen, at 425° C. for 60 minutes. Materials P1, P2, P3, and a layer of Shipley I-line photoresist were exposed to several plasma chemistries under experimental conditions given below in Table 2 in a Mattson Technology ASPEN model ICP plasma reactor.

TABLE 2

Plasma Conditions

| Exp. # | Process Gases | Gas Flows (sccm) | Process Time (s) | Temperature (° C.) | Power (W) | Pressure (Torr) |
| --- | --- | --- | --- | --- | --- | --- |
| 1 | O$_2$/N$_2$ | 3000/150 | 10 | 250 | 1100 | 1.4 |
| 2 | H$_2$/N$_2$ | 80/2000 | 10 | 250 | 1100 | 1.4 |
| 3 | H$_2$/N$_2$/CF$_4$ | 80/2000/50 | 10 | 250 | 1100 | 1.4 |
| 4 | O$_2$/CF$_4$ | 3000/150 | 30 | 25 | 1100 | 1.4 |
| 5 | O$_2$/CF$_4$ | 3000/150 | 30 | 80 | 1100 | 1.4 |
| 6 | O$_2$/CF$_4$ | 3000/150 | 10 | 150 | 1100 | 1.4 |

Results

Photoresist removal rates in excess of 170 Å/s (1 μm/min) may be needed for adequate throughput in the photoresist ashing step. O$_2$/N$_2$ and O$_2$/CF$_4$ plasma chemistries yield such a removal rate. Removal rates of siloxane polymers P1, P2, and P3 are much reduced in a forming gas chemistry compared to the standard process. However, the low photoresist removal rate make this an unattractive option. The O$_2$/CF$_4$ chemistry, at temperatures less than 80° C., shows reduced siloxane polymer removal while maintaining high photoresist removal rates.

Exposure of P1 to the standard O$_2$/N$_2$ plasma at 250° C. resulted in film shrinkage (see Table 4) and oxidation of the film. The forming gas plasma (H$_2$/N$_2$), H$_2$/N$_2$/CF$_4$ mixture and O$_2$/CF$_4$ plasma at temperatures below 80° C. did not oxidize the film appreciably.

Exposure of P2 to the standard O$_2$/N$_2$ plasma at 250° C. resulted in film shrinkage (see Table 4) and oxidation of the film (see FIG. 8), resulting in the formation of Si—OH bonds (3600 cm$^{-1}$) and subsequent adsorbtion of water (3700–3400 cm$^{-1}$). The organic content (1275 and 2950 cm$^{-1}$), hydrogen content (2250 cm$^{-1}$) and the asymmetric Si—O peak (1150 cm$^{-1}$) within the film was also reduced. The adsorbed water represents a processing issue during the barrier metal deposition step in via formation. The forming gas plasma and O$_2$/CF$_4$ plasma at temperatures below 80° C. did not oxidize the film appreciably and retained the organic content, Si—H peak and the asymmetric Si—O peak (see FIG. 9). Thus a film exposed to an O$_2$/CF$_4$ plasma ash at 25° C. will experience less shrinkage and hydration and result in ultimately a lower dielectric constant film when compared to films expose to standard ashing conditions.

Exposure of P3 to the standard O$_2$/N$_2$ plasma at 250° C. resulted in film shrinkage (see Table 4) and oxidation of the film (see FIG. 10), resulting in the formation of Si—OH bonds (3600 cm$^{-1}$) and subsequent adsorbtion of water (3700–3400 cm$^{-1}$). The organic content (1275 and 2950 cm$^{-1}$), hydrogen content (2250 cm$^{-1}$) and the asymmetric Si—O peak (1150 cm$^{-1}$) within the film was also reduced. The forming gas plasma and O$_2$/CF$_4$ plasma at a temperature of 25° C. did not oxidize the film appreciably and retained most of the organic content, Si—H peak and the asymmetric Si—O peak (see FIG. 11). Thus an O$_2$/CF$_4$ plasma ash at 25° C. will result in similar process improvements as the P2 case.

TABLE 4

Film Shrinkage Rate Post Plasma Exposure

| Gas Chemistries | I-Line Resist (Å/s) | P1 (Å/s) | P2 (Å/s) | P3 (Å/s) |
| --- | --- | --- | --- | --- |
| O$_2$/N$_2$ @ 250° C. | 760 | 36 | 35 | 92 |
| H$_2$/N$_2$ 250° C. | 38 | 11 | 17 | 4 |
| H$_2$/N$_2$/CF@ 250° C. | 29 | 13 | 22 | 2 |
| O$_2$/CF @ 25° C. | 209 | 10 | 8 | 11 |
| O$_2$/CF$_4$ @ 80° C. | 264 | 17 | 18 | 26 |
| O$_2$/CF$_4$ @ 150° C. | 242 | 41 | 45 | 94 |

Figure 6:
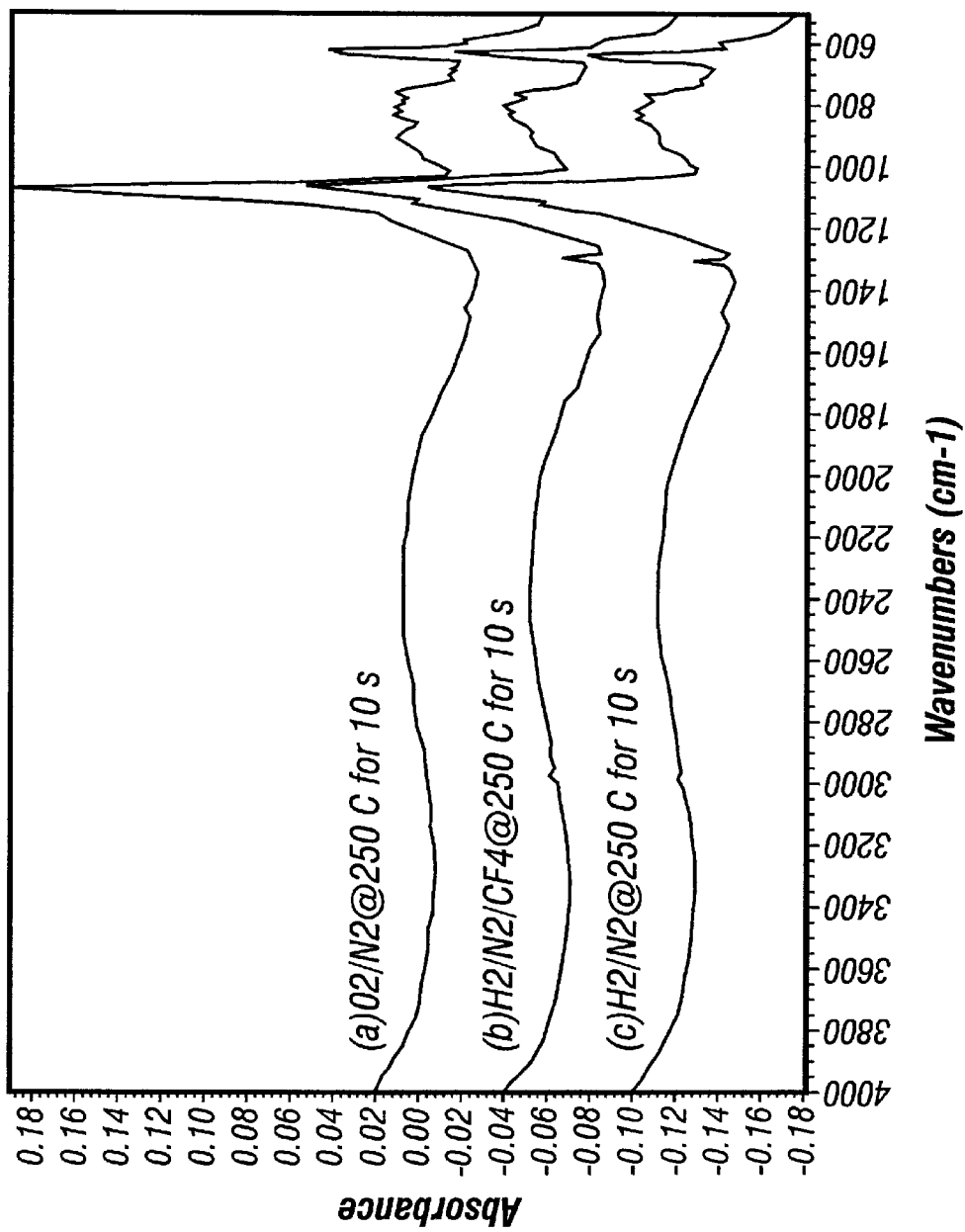
FIG. 6 is an FTIR spectrum of a methyl siloxane polymer film after exposure to the following plasma conditions: (a) $O_2/N_2$ at 250° C. for 10 seconds, (b) $H_2/N_2/CF_4$ at 250° C. for 10 seconds, and (c) $H_2/N_2$ plasmas at 250° C. for 10 seconds.
Figure 7:
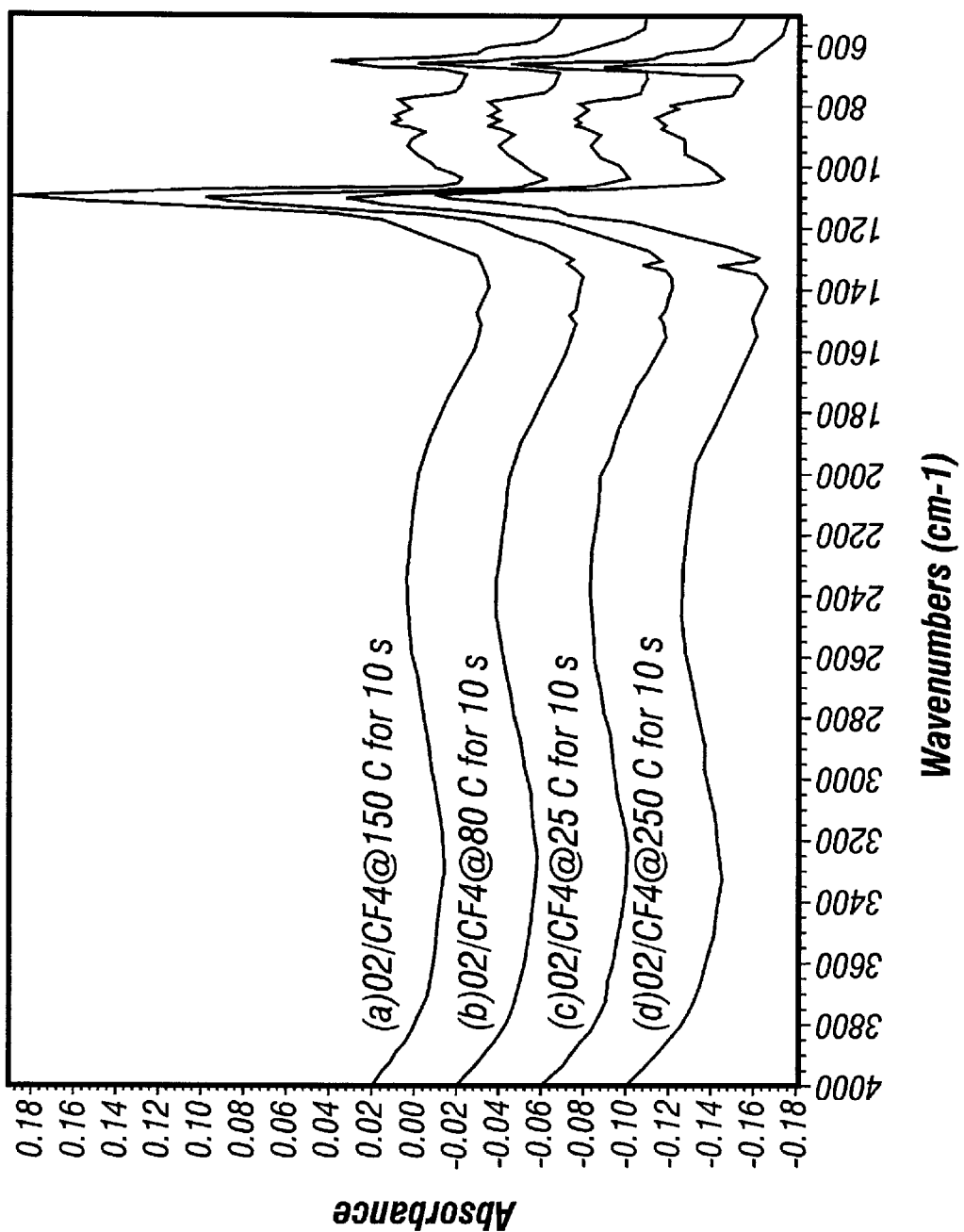
FIG. 7 is an FTIR spectrum of a methyl siloxane polymer film after exposure to the following plasma conditions: (a) $O_2/CF_4$ at 150° C. for 10 seconds, (b) $O_2/CF_4$ at 80° C. for 30 seconds, (c) $O_2/CF_4$ at 25° C. for 30 seconds, and (d) $H_2/N_2$ at 250° C. 10 seconds.

The FTIR spectrum presented in FIG. 6 shows that the prior art high temperature H$_2$/N$_2$ ash at 250° C. did not damage the P1 film. It retained the Si—C and C—H peaks at 1275 and 2950 cm$^{-1}$. The H$_2$/N$_2$/CF$_4$ ash at 250° C. yielded results similar to the prior art H$_2$/N$_2$ ash. However, the ash rate for these plasmas was quite low (<1 μm/min). The film exposed to the O$_2$/N$_2$ plasma ash at 250° C. had no remaining organic peaks. This reduction in carbon content will lead to unwanted film shrinkage and an increase in film dielectric constant. The FTIR spectrum presented in FIG. 7 shows that films exposed to the control H$_2$/N$_2$ ash at 250° C. and O$_2$/CF$_4$ at 80° C. and 25° C. produce acceptable quality films since they each retain organic peaks at 1250 and 3000 cm$^{-1}$. The film exposed to the O$_2$/CF$_4$ ash at 150° C. is considered to be unacceptable since it does not retain organic peaks at 1250 and 2950 cm$^{-1}$.

Figure 8:
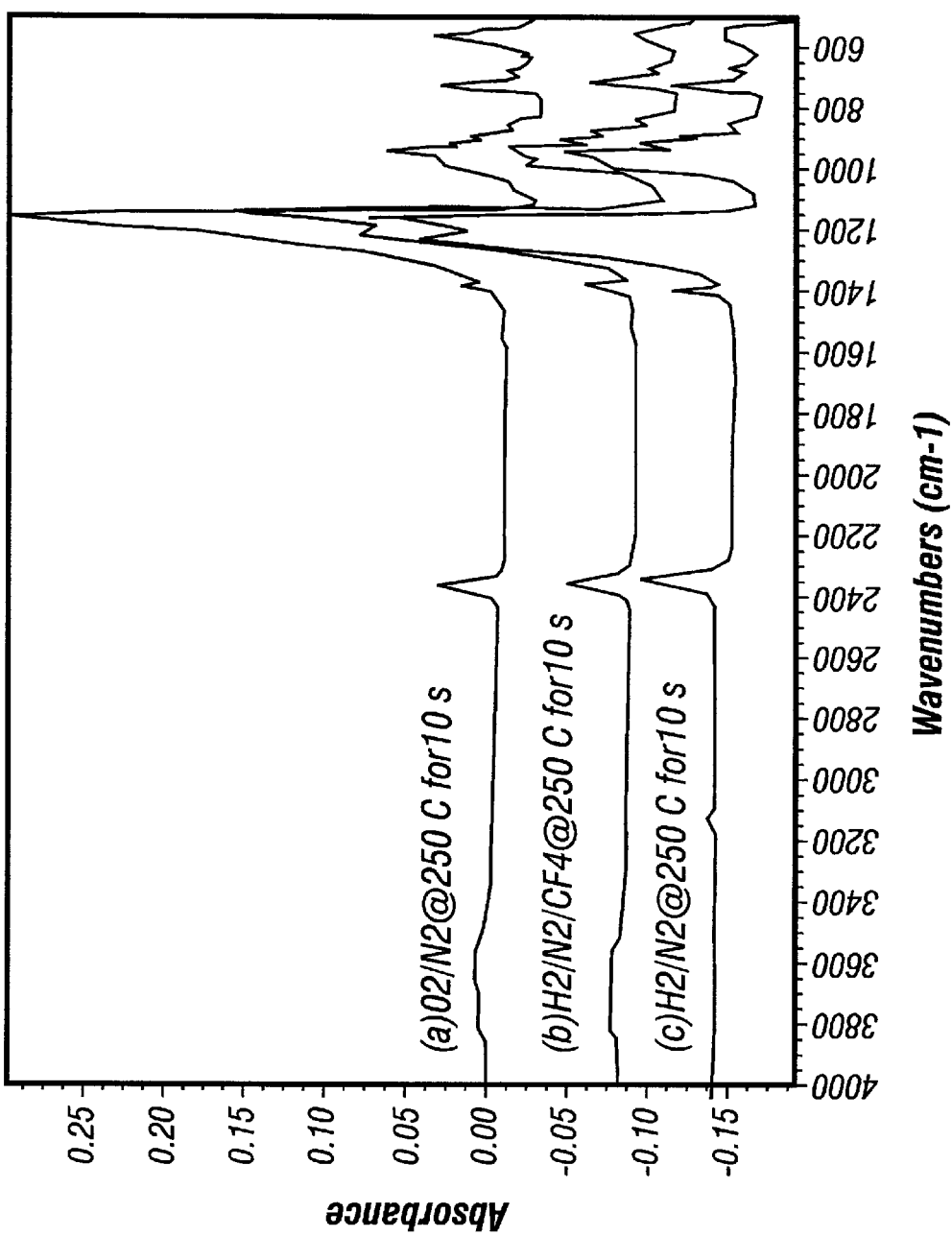
FIG. 8 is an FTIR spectrum of a 20% methyl, methylhydridosiloxane polymer film after exposure to the following plasma conditions: (a) $O_2/N_2$ at 250° C. for 10 seconds, (b) $H_2/N_2/CF_4$ @250° C. for 10 seconds, and (c) $H_2/N_2$ at 250° C. for 10 seconds.
Figure 10:
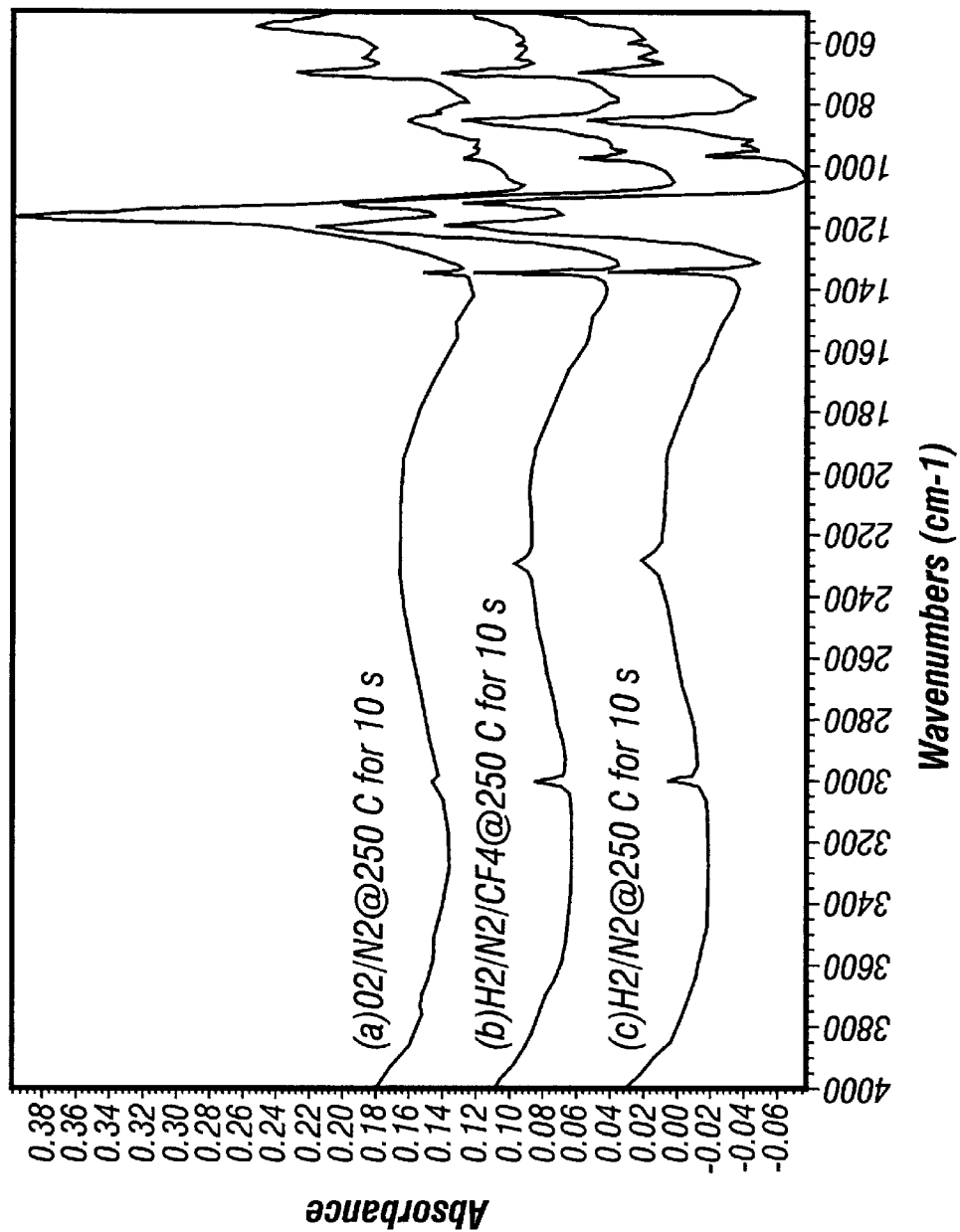
FIG. 10 is an FTIR spectrum of an 80% methyl, methylhydridosiloxane polymer film after exposure to the following plasma conditions: (a) $O_2/N_2$ at 250° C. for 10 seconds, (b) $H_2/N_2/CF_4$ @250° C. for 10 seconds, and (c) $H_2/N_2$ at 250° C. for 10 seconds.

The FTIR spectrum of P2 and P3 after exposure to a H$_2$/N$_2$ ash at 250° C., presented in FIGS. 8 and 10 respectively, showed no film damage. The spectra contain a C—H group at 2950 cm$^{-1}$, a Si—H group at 2250 cm$^{-1}$, a Si—C group at 1275 cm$^{-1}$ and asymmetric and symmetric Si—O groups at 1150 and 1050 cm$^{-1}$ respectively. Exposure of the film to a O$_2$/N$_2$ plasma ash at 250° C. resulted in reduction in Si—H, C—H and Si—C intensity indicating loss of hydrogen and carbon from the film. This loss in hydrogen and carbon coupled with formation of Si—OH groups and adsorbed water at wavenumbers between 3700 and 3400 cm$^{-1}$ and the loss of the asymmetric Si—O stretch at 1150 cm$^{-1}$ resulted in unwanted film shrinkage and an increase in the dielectric constant of the film.

Figure 9:
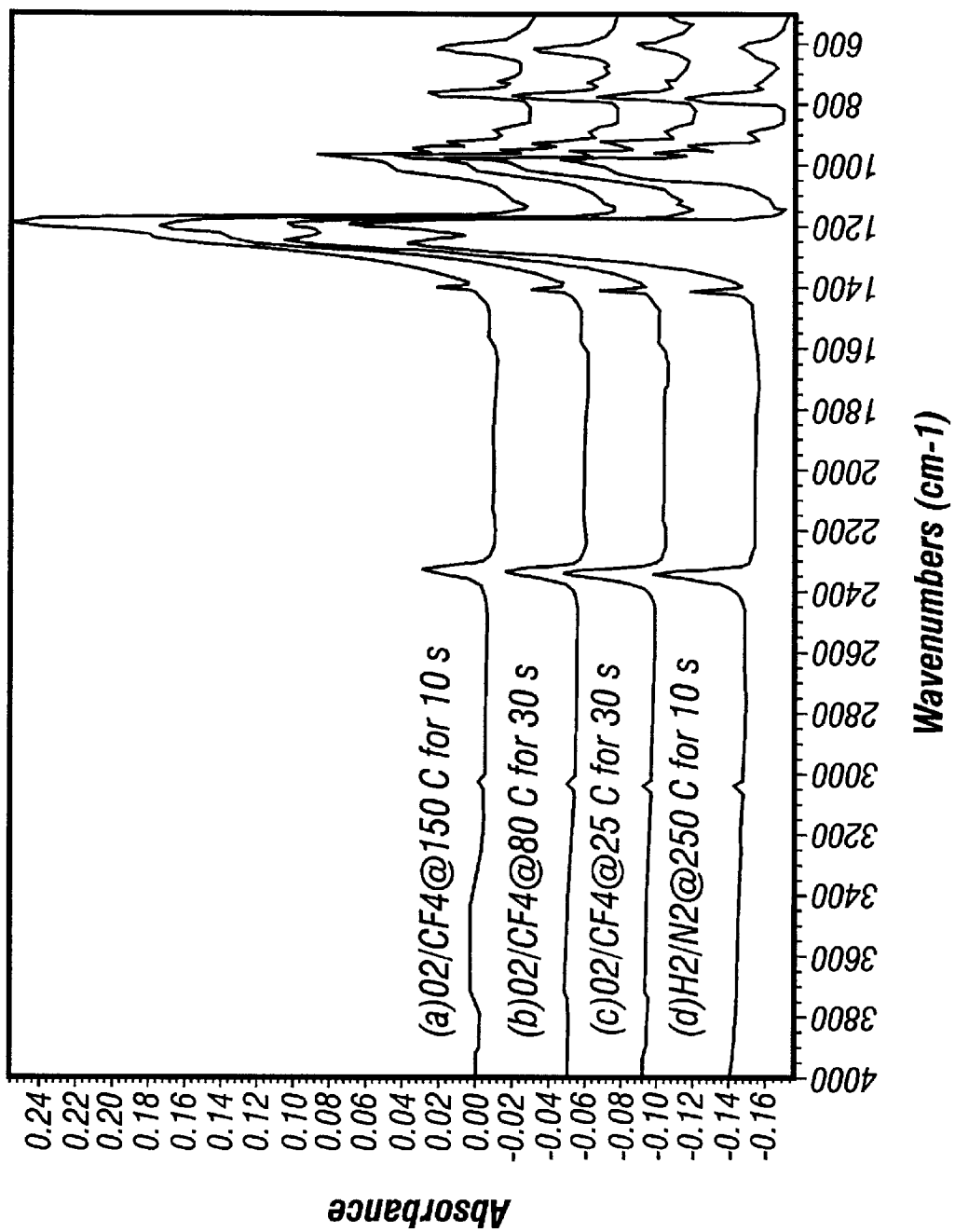
FIG. 9 is an FTIR spectrum of a 20% methyl, methylhydridosiloxane polymer film after exposure to the following plasma conditions: (a) $O_2/CF_4$ at 150° C. for 10 seconds, (b) $O_2/CF_4$ at 80° C. for 30 seconds, (c) $O_2/CF_4$ at 25° C. for 30 seconds, and (d) $H_2/N_2$ at 250° C. for 10 seconds.
Figure 11:
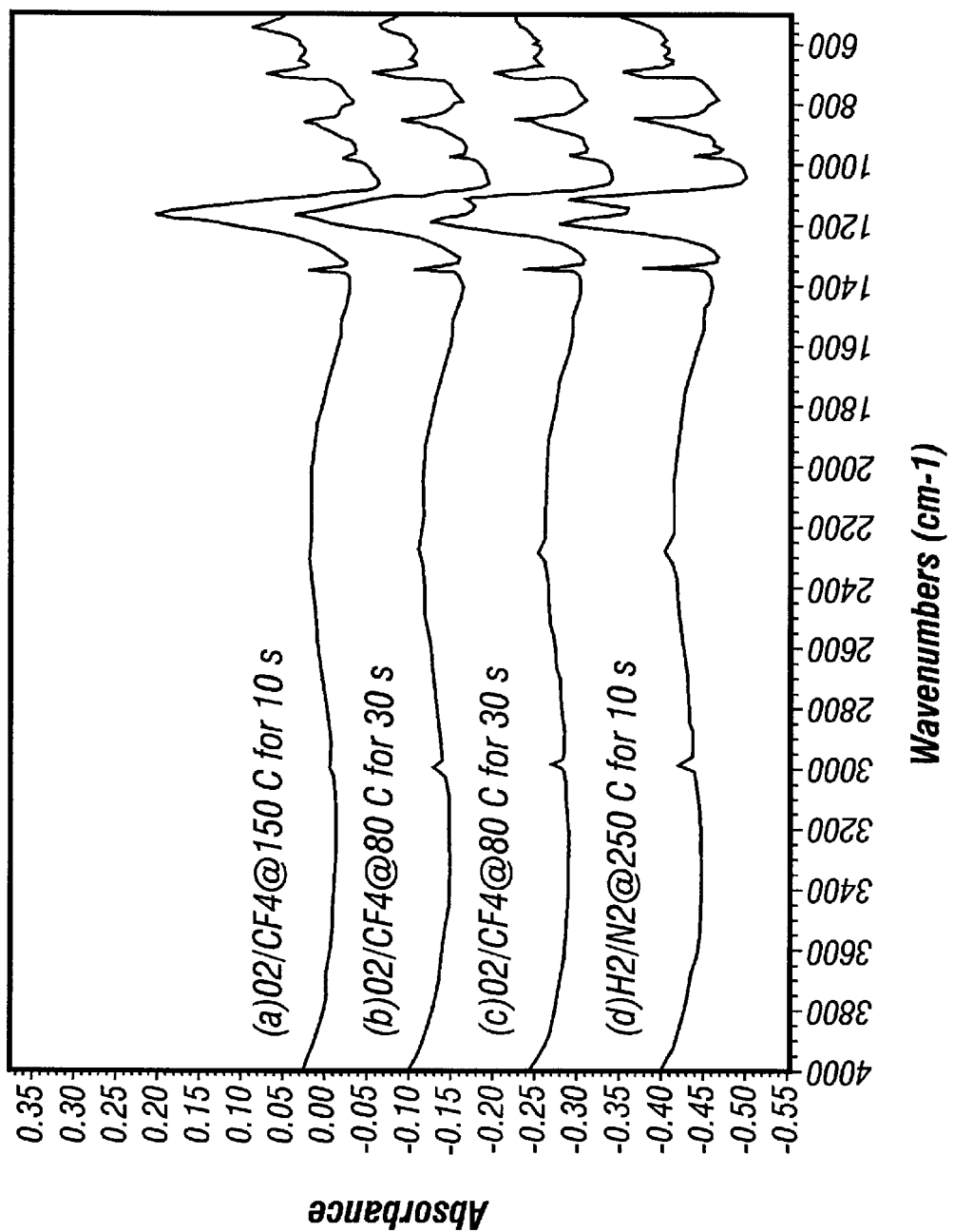
FIG. 11 is an FTIR spectrum of an 80% methyl, methylhydridosiloxane polymer film after exposure to the following plasma conditions: (a) $O_2/CF_4$ at 150° C. for 10 seconds, (b) $O_2/CF_4$ at 80° C. for 30 seconds, (c) $O_2/CF_4$ at 25° C. for 30 seconds, and (d) $H_2/N_2$ at 250° C. for 10 seconds.

The FTIR spectrum of P2 and P3 exposed to an O$_2$/CF$_4$ ash is presented in FIGS. 9 and 11 respectively. The films display only a small Si—H loss after each $O_2/CF_4$ film ash. The Si—H intensity, asymmetric Si—O peak at 1150 cm$^{-1}$ and symmetric Si—O peak at 1050 cm$^{-1}$ are, however, reduced with increasing ash temperature. Acceptable film quality is achieved with $O_2/CF_4$ ash at temperatures below 80° C.

From the data in FIGS. 6–11 it is concluded that plasma ashing with an $O_2/N_2$ ash results in removal of certain organic and inorganic species from the dielectric film, i. e. Si—C, C—H and Si—H. In addition exposure of the film to the plasma results in the formation of silanol groups which subsequently absorb moisture from the ambient. This change in film composition results in a raised dielectric constant, increased film shrinkage and increased outgassing in subsequent processing steps. These problems are reduced when a fluorine containing compound ash, e. g. $CF_4$ is used as part of the plasma ash at relatively low temperatures.

EXAMPLE 2

This example demonstrates ashing plasma chemistries which remove photoresists at reasonable rates after via etch and which do not damage dielectrics which are susceptible to oxidative damage when exposed in via sidewalls. Materials P2 and P3 were deposited as in Example 1 with the exception that the furnace cure was conducted at 380° C. Materials P2, P3, and a layer of Shipley I-line photoresist were exposed to several plasma chemistries under experimental conditions given below in Table 5 in a Mattson Technology ASPEN model ICP plasma reactor

TABLE 5

| | Plasma Conditions Examined | | | | |
|---|---|---|---|---|---|
| Exp. # | Process Gases | Gas Flows (sccm) | Process Time (s) | Temperature (° C.) | Power (W) | Pressure (Torr) |
| 1 | Control | — | — | — | — | — |
| 2 | $H_2/N_2$ | 80/1920 | **60 | 250 | 950 | 1.0 |
| 3 | $H_2/N_2/CF_4$ | 80/1920/50 | 60 | 250 | 950 | 1.0 |
| 4 | $O_2$ | 3000 | 60 | 25 | 950 | 1.0 |
| 5 | $O_2/CF_4$ | 3000/150 | 60 | 25 | 950 | 1.0 |
| 6 | $O_2/CF_4$ | 3000/150 | 60 | 80 | 950 | 1.0 |
| 7 | $O_2/CF_4$ | 3000/150 | 60 | 150 | 950 | 1.0 |
| 8 | $O_2/N_2$ | 3000/150 | 60 | 250 | 950 | 1.0 |

The ASPEN reactor has a Faraday shield that can be electrically grounded or floating to produce a floating mode or grounded mode plasma. The floating mode plasma has more energetic species than the grounded mode plasma. The effect of exposing a 1400 Å thick film of P2 to an $O_2/CF4$ plasma for varying times and temperatures and to different plasma modes, according to the conditions listed in Table 6 was also investigated.

TABLE 6

| | Plasma conditions for $O_2/CF_4$ etching of P2. | | | | | |
|---|---|---|---|---|---|---|
| Exp. # | Process Gases | Gas Flows (sccm) | Process Time (s) | Temperature (° C.) | Power/Mode (W) | Pressure (Torr) |
| 1 | Control | — | — | — | — | — |
| 2 | $O_2/CF_4$ | 3000/150 | 10 | 25 | 950/Grounded | 1.0 |
| 3 | $O_2/CF_4$ | 3000/150 | 30 | 25 | 950/Grounded | 1.0 |
| 4 | $O_2/CF_4$ | 3000/150 | 60 | 25 | 950/Grounded | 1.0 |
| 5 | $O_2/CF_4$ | 3000/150 | 10 | 80 | 950/Grounded | 1.0 |

TABLE 6-continued

| | Plasma conditions for $O_2/CF_4$ etching of P2. | | | | | |
|---|---|---|---|---|---|---|
| Exp. # | Process Gases | Gas Flows (sccm) | Process Time (s) | Temperature (° C.) | Power/Mode (W) | Pressure (Torr) |
| 6 | $O_2/CF_4$ | 3000/150 | 30 | 80 | 950/Grounded | 1.0 |
| 7 | $O_2/CF_4$ | 3000/150 | 60 | 80 | 950/Grounded | 1.0 |
| 8 | $O_2/CF_4$ | 3000/150 | 10 | 25 | 950/Floating | 1.0 |
| 9 | $O_2/CF_4$ | 3000/150 | 30 | 25 | 950/Floating | 1.0 |
| 10 | $O_2/CF_4$ | 3000/150 | 60 | 25 | 950/Floating | 1.0 |

Results

Figure 12:
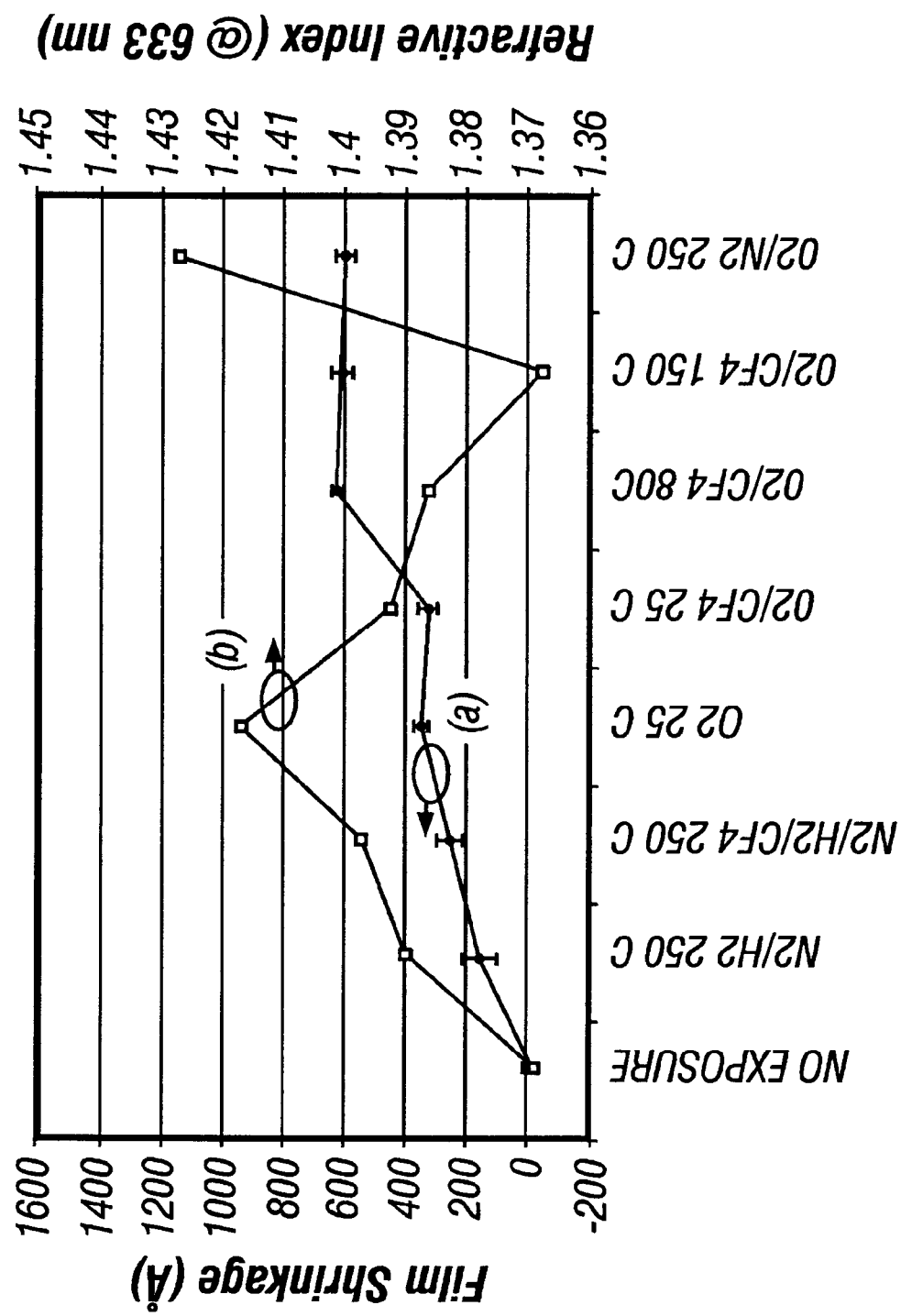
FIG. 12 shows (a) the film shrinkage and (b) the refractive index change of a 20% methyl, methylhydridosiloxane polymer film after exposure to various plasma conditions.

In FIG. 12, the film shrinkage and refractive index of P2 after exposure to plasmas listed in Table 6 are presented. Exposure to a conventional plasma such as a $N_2/O_2$ ash at 250° C. resulted in high refractive index and film shrinkage. Exposure to plasmas containing $N_2/H_2$, $N_2/H_2/CF_4$, and $O_2/CF_4$ resulted in films with less shrinkage and lower refractive indices.

Figure 13:
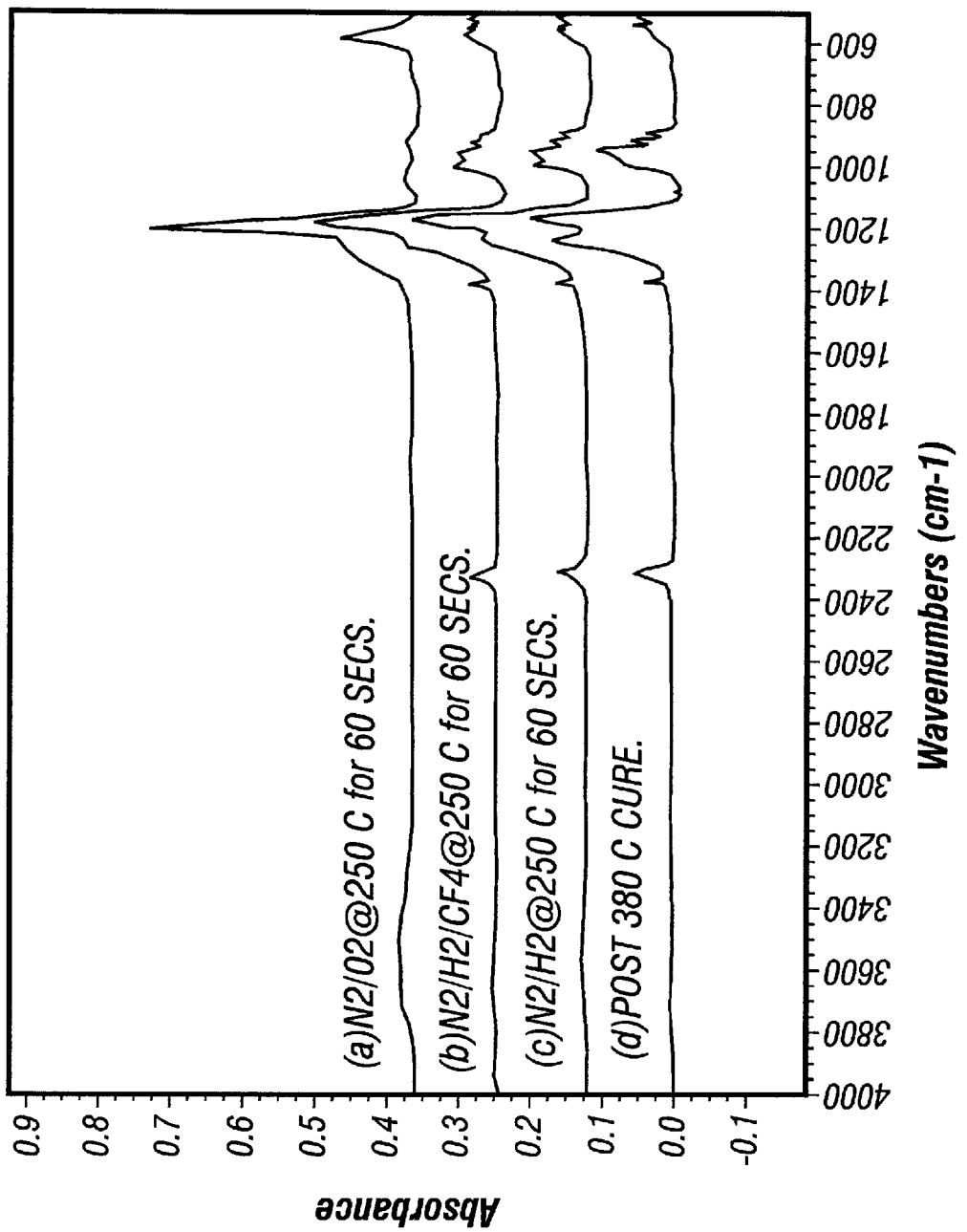
FIG. 13 is an FTIR spectrum of a 20% methyl, methylhydridosiloxane polymer film after exposure to the following plasma conditions: (a) $O_2/N_2$ at 250° C. for 60 seconds, (b) $H_2/N_2/CF_4$ @250° C. for 60 seconds, (c) $H_2/N_2$ at 250° C. for 6 seconds, and (d) no plasma exposure.

The FTIR spectrum of P2 after cure is presented in FIG. 13. The spectrum contains a C—H group at 2950 cm$^{-1}$, a Si—H group at 2250 cm$^{-1}$, a Si—C group at 1275 cm$^{-1}$ and asymmetric and symmetric Si—O groups at 1150 and 1050 cm$^{-1}$, respectively. Exposure of the film to an $N_2/H_2$ and $N_2/H_2/CF_4$ plasma resulted in minor change to the FTIR spectrum.

Exposure of the film to a $O_2/N_2$ plasma ash at 250° C. resulted in reduction in Si—H, C—H and Si—C intensity indicating loss of hydrogen and carbon from the film. This loss in hydrogen and carbon coupled with formation of Si—OH groups and adsorbed water at wavenumbers between 3700 and 3400 cm$^{-1}$ and the loss of the asymmetric Si—O stretch at 1150 cm$^{-1}$ results in unwanted film shrinkage and an increase in the dielectric constant of the film.

Figure 14:
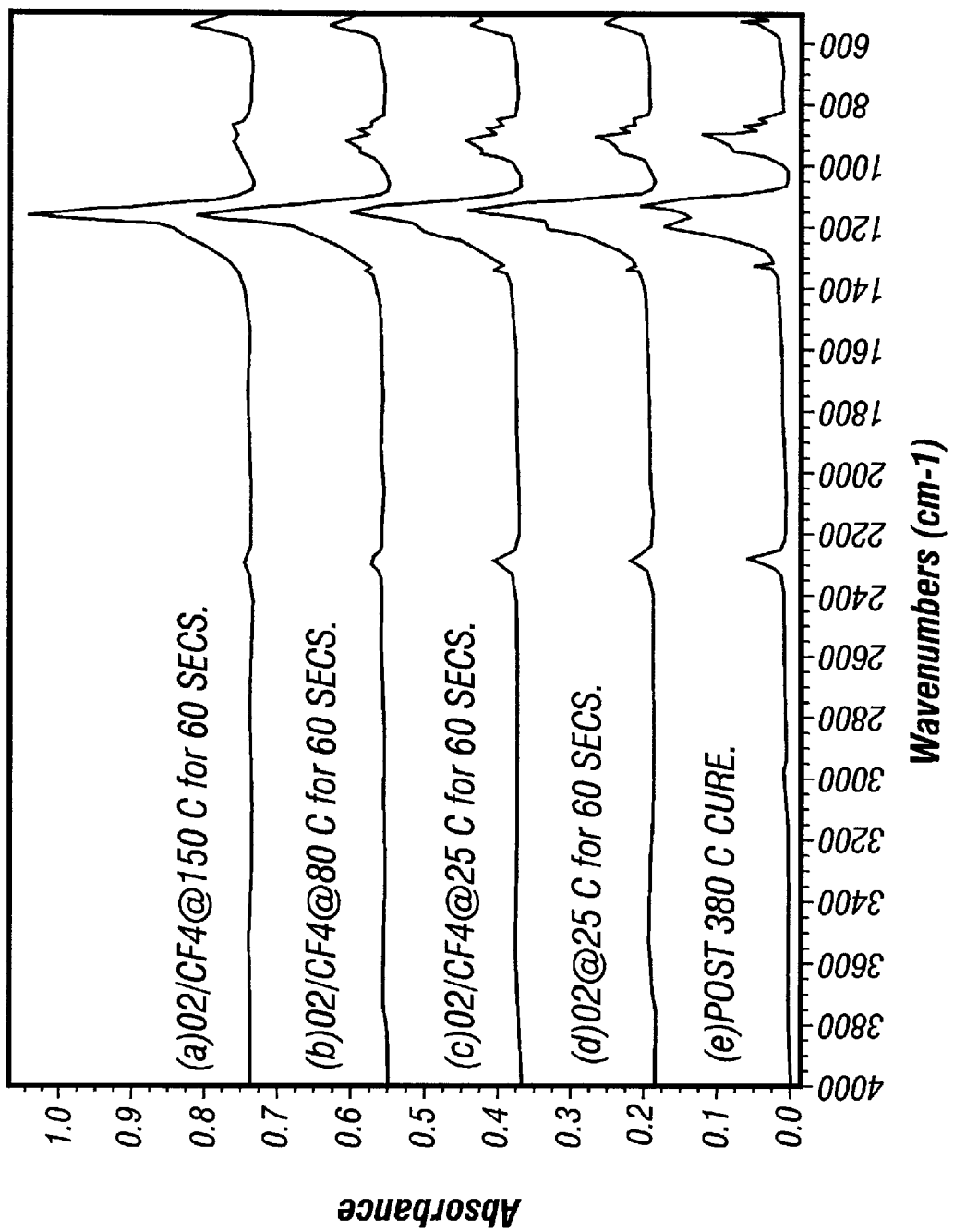
FIG. 14 is an FTIR spectrum of a 20% methyl, methylhydridosiloxane polymer film after exposure to the following plasma conditions: (a) $O_2/CF_4$ at 150° C. for 60 seconds, (b) $O_2/CF_4$ at 80° C. for 60 seconds, (c) $O_2/CF_4$ at 25° C. for 60 seconds, (d)$O_2$ at 25° C. for 60 seconds, and (e) no plasma exposure.

The FTIR spectrum of P2 exposed to an $O_2/CF_4$ ash is presented in FIG. 14. The film displays some Si—H loss after each $O_2/CF_4$ film ash. The Si—H intensity, asymmetric Si—O peak at 1150 cm$^{-1}$ and symmetric Si—O peak at 1050 cm$^{-1}$ are, also reduced with increasing ash temperature. These changes in FTIR spectrum are more pronounced than changes observed in Experiment 1 with a 30-second exposure time. This indicates that shorter exposure times will aid in retaining optimal film properties. However, acceptable film quality is achieved with $O_2/CF_4$ ash at temperatures below 80° C.

Figure 15:
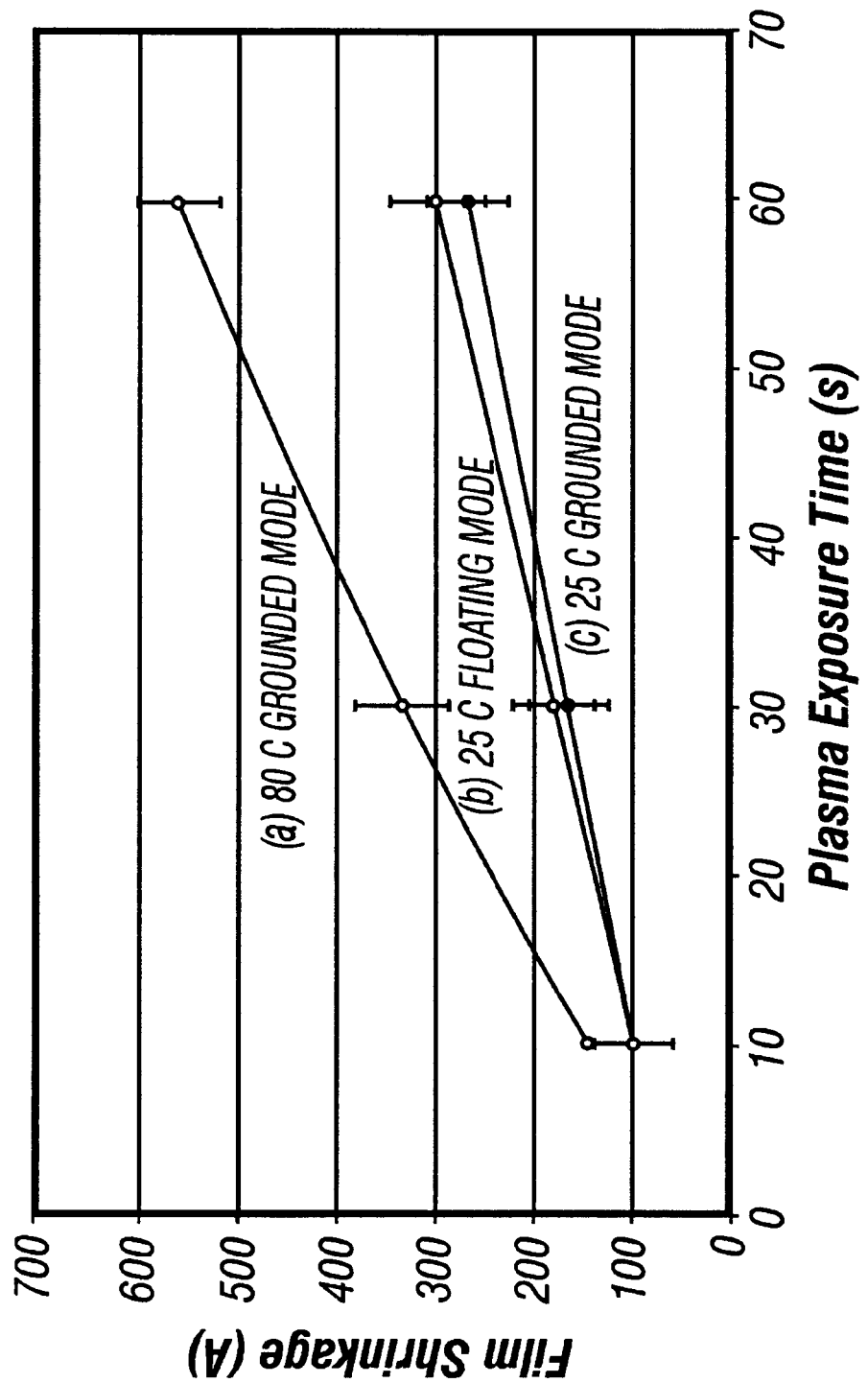
FIG. 15 shows the film shrinkage of a 20% methyl, methylhydridosiloxane polymer film after exposure to the following plasma conditions: (a) $O_2/CF_4$ at 80° C. for 60 seconds, grounded mode, (b) $O_2/CF_4$ at 25° C. for 60 seconds, floating mode, and (c) $O_2/CF_4$ at 25° C. for 60 seconds, grounded mode.

FIG. 15 displays the film shrinkage of the P2 film after exposure to $O_2/CF_4$ plasmas in floating mode and grounded mode respectively. Data at 25° C. indicates that, for a 60-second exposure, that plasma operation may be carried out in grounded or an ungrounded mode.

Dynamic SIMS (Secondary Ion Mass Spectrometry) analysis of P3 films after cure showed high levels of carbon, oxygen, hydrogen and silicon. After a 250° C. ash for 60 seconds with an $O_2/N_2$ plasma, the carbon content within the film is reduced by four orders of magnitude, and the hydrogen content by almost one order of magnitude. This reduction is evident throughout the entire thickness of the P3 layer. The use of an $O_2/CF_4$ plasma at 25° C. for 60 seconds results in surface modification to the film to a depth of 630 Å. The remainder of the film is similar to the post cure film and represents an improvement over the standard $O_2/N_2$ ash.

EXAMPLE 3

A metal interconnect wafer structure is formed in a standard aluminum etch process. A 4000 Å thick film of 80% methyl, methylhydridosiloxane polymer (P3) is spun onto the substrate and baked for one minute each on three successive hotplates at 150° C., 200° C. and 350° C. The wafer is annealed in a furnace at 400° C. for 60 minutes to fully crosslink the polymer. A 2000 Å thick film of PECVD TEOS oxide is then deposited on the P3 film. Photoresist is then spun, baked, patterned and developed on the oxide. A via mask is formed above a metal line which is underneath the oxide- P3-oxide sandwich. The wafer is exposed to etching chemistry in a plasma chamber using a HDP etcher with a fluorocarbon active species. The via is etched through the oxide- P3-oxide sandwich to an underlying metal substrate. This etching removes some of the photoresist on the top oxide and deposits organic/inorganic residues on the side wall of the etched via. To remove this unetched resist and residue in the vias, the wafer is exposed to an ashing step in a Mattson ASPEN ICP plasma reactor. The wafer to be ashed is placed on a platen at room temperature (25° C.). The ashing chamber is evacuated and an $O_2/CF_4$ plasma is generated. The oxygen flow is 3000 sccm and the $CF_4$ flow is 150 sccm. The process pressure is 1.4 torr. This process is conducted at room temperature until the photoresist is removed. The plasma power is 1100 W. After ashing, the wafer is removed and rinsed in EKC 265 solvent, provided by EKC Technologies, to remove post etch metal residues.

EXAMPLE 4

A via is etched in a semiconductor structure consisting of photoresist, oxide, polymer P3, oxide and a metal interconnect as described in Example 3, above. To remove the unetched resist and residue in the vias, the wafer is exposed to a brief ashing step in a Mattson ASPEN model ICP plasma reactor under the plasma conditions described above. The wafer is ashed at room temperature for 5 seconds to remove the top crust of the etched photoresist. After the partial removal of photoresist at room temperature, the remainder of the photoresist is removed using a standard 95%$N_2$/5%$H_2$ (forming gas) resist ash at 250° C. The forming gas flow rate is 2000 sccm and the process pressure is 1.4 torr. This process is conducted at 250° C. until the remaining resist is removed. After ashing, the wafer is removed and rinsed in EKC 265 solvent, provided by EKC Technologies, to remove post etch metal residues.

EXAMPLE 5

In this example the interconnect layer is formed by means of a damascene integration route. After chemical mechanical polishing of underlying dielectric layers to achieve global planarization, a thin copper diffusion barrier layer of $Si_3N_4$ (500 Å) is deposited on a wafer by a PECVD reaction of $SiH_4$ and NH3. A 6000 Å layer of an 80% methyl, methylhydridosiloxane polymer is deposited on the wafer. The film is baked for one minute each on three consecutive hot plates at 150° C., 200° C. and 350° C. The wafer is annealed in a furnace at 400° C. for 60 minutes. An 1000 Å thick PECVD $Si_3N_4$ etchstop layer is deposited on the film. A second 6000 Å thick layer of methylhydridosiloxane is deposited on the etchstop layer and baked and cured as above. A 1000 Å PECVD $SiO_2$ hardmask is deposited on the second methylhydridosiloxane layer. A photoresist layer is spun, baked, patterned and developed on the hard mask with a via mask opened above a lower metal interconnect which is below the hard mask-methylhydridosiloxane—etchstop-methylhydridosiloxane—copper diffusion barrier stack. The hard mask and the entire stack is etched using a fluorocarbon etch chemistry in a HDP anisotropic etching tool.

The wafer is placed in an ashing chamber with the wafer platen at 10° C. Gases flowing in the plasma chamber are $O_2$ and $CF_4$. The oxygen flow rate is 3000 sccm and the $CF_4$ flow rate is 150 sccm, the processing pressure is 1.4 torr, and the operating power is 1100 W. The wafer is exposed to these conditions for 5 seconds to remove the top crust of the etched photoresist. After partial ashing, the wafer is removed and exposed to post etch residue cleaning solvent ACT 970, provided by Ashland Chemical, and a deionized water rinse to remove remaining photoresist. A second layer of photoresist is spun on the hard mask- methylhydridosiloxane—etchstop-methylhydridosiloxane—copper diffusion barrier stack. This resist is patterned and developed in a standard method. The resist forms an interconnect trench mask which is superimposed on the via structures already formed. The dimensions of the interconnect trench mask are wider than that of the formed via. The wafer is then exposed to similar etch chemistries as before for a time to etch a self aligned interconnect into the dielectric material, extending approximately one-half way into the dielectric stack and stopping on the etchstop PECVD $Si_3N_4$ layer. This resist is then ashed according to the two-step photoresist removal method described above.

We claim:

1. A process for removing photoresist present on a dielectric layer on a substrate and on the inside walls of microvias or trenches formed in the dielectric layer, the process comprising:
    introducing a substrate having a dielectric layer thereon, and a photoresist layer on the dielectric layer and on the inside walls of microvias or trenches formed in the dielectric layer into a plasma generator;
    generating a plasma in the plasma generator from a gas comprising one or more fluorine compound containing etchant gases; and
    isotropically etching said photoresist layer with the plasma at a temperature of from about 0° C. to about 90° C. and at a pressure of from about 10 torr or less, to thereby remove the photoresist present on the dielectric layer and on the inside walls of the microvias or trenches.

2. The process of claim 1 wherein the dielectric layer comprises a silicon containing polymer.

3. The process of claim 1 wherein the dielectric layer comprises a spin-on glass material.

4. The process of claim 1 wherein the dielectric layer comprises an alkoxysilane polymer, a silsesquioxane polymer, a siloxane polymer, an organohydridosiloxane polymer, a poly(arylene ether), a fluorinated poly(arylene ether) or mixtures thereof.

5. The process of claim 1 wherein the dielectric layer comprises an alkoxysilane polymer formed from an alkoxysilane monomer which has the formula $SiR_4$, wherein at least 2 of the R groups are independently $C_1$ to $C_4$ alkoxy groups and the balance, if any, are independently selected from the group consisting of hydrogen, alkyl, phenyl, halogen, substituted phenyl.

6. The process of claim 5 wherein each R is methoxy, ethoxy or propoxy.

7. The process of claim 1 wherein the dielectric layer comprises an organic dielectric material.

8. The process of claim 1 wherein the fluorine containing compound comprises $C_xF_y$, wherein x is 1–4 and y is either 2x or 2x+2; $C_xH_zF_y$, wherein x is 1–4, y is either from 1 to 2x+1 or from 1 to 2x−1, and z is 2x+2−y when y ranges from 1 to 2x+1 or 2x−y when y ranges from 1 to 2x−1; $NF_3$; $SF_6$; or mixtures thereof.

9. The process of claim 1 wherein fluorine compound containing etchant gases comprises a material selected from the group consisting of $CF_4$, $SF_6$, NF3, and mixtures thereof.

10. The process of claim 1 wherein said etchant gas further comprises a material selected from the group consisting of $O_2$, $N_2$, $H_2$, ammonia, water vapor, inert gases and mixtures thereof.

11. The process of claim 1 wherein said fluorine containing compound comprises $CF_4$.

12. The process of claim 1 wherein said etchant gas comprises $CF_4$ and $O_2$.

13. The process of claim 1 wherein said etchant gas comprises a fluorine containing compound in an amount of from about 0.1% to about 10% by volume of the etchant gas.

14. The process of claim 1 wherein said etchant gas comprises $O_2$ in an amount of from about 50% to about 99.9% by volume of the etchant gas.

15. The process of claim 1 wherein said etchant gas comprises $N_2$ in an amount of from about 0% to about 95% by volume of the etchant gas.

16. The process of claim 1 wherein said etchant gas comprises hydrogen in an amount of from about 0% to about 15% by volume of the etchant gas.

17. The process of claim 1 wherein said etchant gas comprises water vapor in an amount of from about 25% to about 96% by volume of the etchant gas.

18. The process of claim 1 wherein the temperature ranges from about 10° C. to about 30° C.

19. The process of claim 1 wherein the pressure ranges from about 0.01 torr to about 10 torr.

20. The process of claim 1 wherein the pressure ranges from about 0.5 torr to about 5 torr.

21. The process of claim 1 wherein the pressure ranges from about 0.5 torr to about 1.5 torr.

22. The process of claim 1 wherein the substrate comprises a material selected from the group consisting of gallium arsenide, silicon, and compositions containing silicon.

23. The process of claim 22 wherein the substrate comprises a material selected from the group consisting of crystalline silicon, polysilicon, amorphous silicon, epitaxial silicon, and silicon dioxide, and mixtures thereof.

24. The process of claim 1 wherein the substrate has a pattern of lines on its surface.

25. The process of claim 1 wherein the substrate has a pattern of lines on its surface wherein the lines comprise a metal or polysilicon.

26. The process of claim 1 further comprising the subsequent step of contacting the dielectric layer with an organic solvent.

27. The process of claim 26 wherein the organic solvent comprises an amine.

28. A process for removing photoresist present on a dielectric layer on a substrate and on the inside walls of microvias or trenches formed in the dielectric layer, the process comprising a first photoresist removal process comprising:
    introducing a substrate having a dielectric layer thereon, and a photoresist layer on the dielectric layer and on the inside walls of microvias or trenches formed in the dielectric layer into a plasma generator,
    generating a plasma in the plasma generator from a gas comprising one or more fluorine compound containing etchant gases, and
    isotropically etching said photoresist layer with the plasma at a temperature of from about 0° C. to about 90° C. and at a pressure of from about 10 torr or less, for a time period to remove a portion of the photoresist present on the dielectric layer; and
    a second photoresist removal process different from the first photoresist removal process.

29. The process of claim 28 wherein the second photoresist removal process comprises contacting the dielectric layer with an organic solvent.

30. The process of claim 28 wherein the second photoresist removal process comprises etching the dielectric layer with a plasma generated from etchant gases comprising $N_2$ and $H_2$.

31. The process of claim 28 wherein the time period is from about 3 seconds to about 10 seconds.

32. The process of claim 28 wherein the first photoresist removal process is performed before the second photoresist removal process.

33. The process of claim 30 wherein the second photoresist removal process is performed before the first photoresist removal process.

* * * * *